United States Patent [19]

Scheibe

[11] 4,420,871

[45] Dec. 20, 1983

[54] METHOD OF PRODUCING A MONOLITHICALLY INTEGRATED TWO-TRANSISTOR MEMORY CELL IN ACCORDANCE WITH MOS TECHNOLOGY

[75] Inventor: Adolf Scheibe, Ottobrunn, Fed. Rep. of Germany

[73] Assignee: Siemens Aktiengesellschaft, Berlin and Munich, Fed. Rep. of Germany

[21] Appl. No.: 307,884

[22] Filed: Oct. 2, 1981

[30] Foreign Application Priority Data

Oct. 6, 1980 [DE] Fed. Rep. of Germany ....... 3037744

[51] Int. Cl.³ ...................... H01L 21/76; H01L 21/88; H01L 21/95
[52] U.S. Cl. .................................. 29/571; 29/576 B; 29/578; 29/577 R; 357/43; 357/59
[58] Field of Search ...................... 29/571, 577, 577 C, 29/576 J, 576 B, 578; 148/1.5, 187; 357/41, 43, 59

[56] References Cited

U.S. PATENT DOCUMENTS

| | | | |
|---|---|---|---|
| 4,112,575 | 9/1978 | Fu et al. | 29/577 C |
| 4,179,793 | 12/1979 | Hagiwara | 29/578 |
| 4,193,183 | 3/1980 | Klein | 29/578 |
| 4,345,365 | 8/1982 | Carrigan | 29/571 |

OTHER PUBLICATIONS

Publication "IEEE Trans. Electron Devices", vol. ED-24, pp. 600–606 (May 1977).

*Primary Examiner*—Brian E. Hearn
*Assistant Examiner*—David A. Hey
*Attorney, Agent, or Firm*—Herbert L. Lerner; Laurence A. Greenberg

[57] ABSTRACT

A method of producing a monolithically integrated two-transistor memory cell, including a silicon crystal for accommodating the memory cell, a first MOS field effect transistor having a current-carrying channel and both a control gate and a floating gate disposed between the control gate and surface of the crystal, a second MOS field effect transistor having a current-carrying channel and a control gate, an $SiO_2$ film supporting the gates, a doped polycrystalline silicon layer deposited on the $SiO_2$ film, the control gates and the floating gate being formed from the doped polycrystalline silicon layer, and an erase area for the floating gate, the improvement which includes covering a part of the silicon crystal intended for the memory cell with an $SiO_2$ film, forming a part of the gate oxide of the first MOS field effect transistor, forming a window through the $SiO_2$ film at a location intended for the erase area, re-oxidizing the exposed area of the surface of the crystal in the window and increasing the remaining areas of the $SiO_2$ film, depositing a first doped polycrystalline silicon layer forming a base of the floating gate, covering the polycrystalline silicon layer with another $SiO_2$ film, depositing a second doped polycrystalline silicon layer, and forming the control gate of the first MOS field effect transistor from the second doped polycrystalline silicon layer and producing the source and drain zone of the two MOS field effect transistors.

9 Claims, 15 Drawing Figures

METHOD OF PRODUCING A MONOLITHICALLY INTEGRATED TWO-TRANSISTOR MEMORY CELL IN ACCORDANCE WITH MOS TECHNOLOGY

The invention relates to a method of producing a monolithically integrated two-transistor memory cell in accordance with MOS technology, in which a first MOS field effect transistor, provided for information storage, is equipped with both a control gate and a floating gate disposed between the control gate and the surface of the silicon crystal accommodating the memory cell, whereas the second MOS field effect transistor is provided only with a control gate; the two control gates and the floating gate are formed by masked etching technology of a doped polycrystalline silicon layer deposited on an $SiO_2$ film supporting the respective gate; and an erase area apart from the current-carrying channel of the two MOS field effect transistors of the memory cell is provided for the floating gate of the first MOS field effect transistor.

Such a method is known from the publication "IEEE Trans. Electron. Devices" Vol. ED-24, pp. 600–606 (May 1977). In the known method, the surface area of the monocrystalline, and particularly p-conducting silicon substrate assigned to the individual memory cell, is covered with a gate oxide film by thermal oxidation. Then a layer of doped polycrystalline silicon, forming the base of the floating gate of the first MOS field effect transistor and possibly also of the control gate of the second MOS field effect transistor, is deposited on the gate oxide film. At least at the location of the later-produced floating gate of the first MOS field effect transistor, this first polycrystalline silicon layer is then again covered by an oxide film, which then forms the base for a second doped polycrystalline silicon layer.

The control gate of the first MOS field effect transistor is then made from the second polycrystalline silicon layer, using photoresist etching technology. If the first polycrystalline silicon layer was previously etched away from the gate oxide film supporting it at the location for the control gate of the second MOS field effect transistor during a temporary formation of the floating gate, the portion of the second polycrystalline layer deposited on the gate oxide for the second transistor will then be processed further to form the control gate of the second MOS field effect transistor. On the other hand, the control gate for the second transistor can also be formed from the first polycrystalline silicon layer, so that the second polycrystalline silicon layer is not needed at the location of the second transistor and is therefore etched away again in a known manner from the oxide film covering the control gate of the second MOS field effect transistor.

In the interest of a favorable and defined erase function when the information content stored in the respective memory cell changes, it would be advantageous if the oxide supporting the floating gate electrode of the first MOS field effect transistor were made thinner in a defined manner in the erase area, than in the channel area of the first MOS field effect transistor. This could be achieved, for example, by localized thin etching of the first oxide set to the normal gate oxide thickness at the location of the intended erase area. However, it has turned out that this production possibility is better replaced by the possibility suggested by the invention, because the thickness of the oxide covering the erase area on the silicon surface then becomes noticeably better reproducible.

It is accordingly an object of the invention to provide a method of producing a monolithically integrated two-transistor memory cell in accordance with MOS technology, which overcomes the hereinafore-mentioned disadvantages of the heretofore-known methods of this general type.

With the foregoing and other objects in view there is provided, in accordance with the invention, in a method of producing a monolithically integrated two-transistor memory cell in accordance with MOS technology, including a silicon crystal for accommodating the memory cell and having a surface, a first MOS field effect transistor for information storage having a current-carrying channel and both a control gate and a floating gate disposed between the control gate and the surface of the crystal, a second MOS field effect transistor having a current-carrying channel and only a control gate, an $SiO_2$ film supporting the gates, a doped polycrystalline silicon layer deposited on the $SiO_2$ film, the control gates and the floating gate being formed by masked etching technology of the doped polycrystalline silicon layer, and an erase area apart from the current-carrying channel of the two MOS field effect transistors of the memory cell for the floating gate of the first MOS field effect transistor, the improvement which comprises initially covering a part of the surface of the silicon crystal intended for the memory cell with an $SiO_2$ film by thermal oxidation forming a part of the gate oxide of the first MOS field effect transistor of the memory cell, forming a window through the $SiO_2$ film at a location intended for the erase area of the memory cell exposing an area of the surface of the silicon crystal and leaving remaining areas of the $SiO_2$ film, subsequently re-oxidizing the exposed area of the surface of the crystal in the window in the erase area and simultaneously increasing the remaining or still existing areas or parts of the $SiO_2$ film to a given final thickness of the gate oxide in a further joint oxidation process producing a new thinner $SiO_2$ film in the window in the erase area, subsequently depositing a first doped polycrystalline silicon layer forming a base of the floating gate of the first MOS field effect transistor on the gate oxide film including the new thinner $SiO_2$ film, covering the doped polycrystalline silicon layer with another $SiO_2$ film at least in the part thereof forming the floating gate, depositing a second doped polycrystalline silicon layer on the other $SiO_2$ film, and forming the control gate of the first MOS field effect transistor from the second doped polycrystalline silicon layer and producing the source and drain zones of the two MOS field effect transistors by at least one of diffusion and/or implantation at sites on the surface of the crystal uncovered for this purpose.

The further development of the invention relates to measures for further improvement of the memory cell function in the erase area.

In accordance with another mode of the invention, there is provided a method which comprises etching away the first doped polycrystalline layer again after it is deposited from the oxide film supporting it at the site of the source and drain area of the first transistor and at an edge of the former window in the intended erase area uncovering parts of the oxide film, the edge facing away from the floating gate to be formed, and leaving the first doped polycrystalline layer intact at least at the site of the floating gate to be formed, and subsequently removing the uncovered parts of the oxide film from the surface of the silicon crystal supporting them.

In accordance with a further mode of the invention, there is provided a method which comprises removing the first polycrystalline silicon layer and the oxide film from the part of the surface of the silicon crystal intended for the second MOS field effect transistor.

In accordance with an added mode of the invention, there is provided a method which comprises producing a coherent oxide film by a joint oxidation process at surface locations or points of the silicon crystal uncovered again directly after producing the first polycrystalline silicon layer and on the surface of the remaining or still present parts of the first polycrystalline layer, and depositing the second polycrystalline silicon layer on the coherent oxide film forming the base of the control gate of the first MOS field effect transistor and optionally forming the base of the control gate of the second field effect transistor.

In accordance with an additional mode of the invention, there is provided a method which comprises forming the control gate of the first MOS field effect transistor and optionally forming the control gate of the second MOS field effect transistor from the second polycrystalline silicon layer by masked etching initially, and subsequently using one of the control gate of the first field effect transistor or the etching mask covering it to form the floating gate from the first polycrystalline silicon layer.

In accordance with again another mode of the invention, there is provided a method which comprises keeping the oxide film located under the floating gate directly after the formation of the floating gate of the first MOS field effect transistor intact without further erosion to avoid oxide fillets.

In accordance with again a further mode of the invention, there is provided a method which comprises providing an implantation treatment with a doping material producing the conductivity type of the source and drain zone of the MOS field effect transistors at least at the site of the first transistor following the production of the gates of both transistors, and adjusting the implantation conditions for allowing incident ions of the doping material to be implanted to travel into the silicon crystal exclusively where the crystal is covered at most by an oxide film alone and not by a combination of an oxide film and a polycrystalline silicon layer.

In accordance with a concomitant mode of the invention, there is provided a method which comprises performing a diffusion treatment following the implantation with a doping material producing the same conductivity type as the implantation at surface points of the silicon crystal not covered during the implantation, and restricting the diffusion treatment to those points alone.

Generally, a multiplicity of memory cells combined into a matrix are produced on the silicon crystal surface in common production operations, furthermore there is an interest in producing as dense a memory cell configuration as possible, and on the other hand, as good an insulation as possible between adjacent memory cells is required for the operation of the memory cells. It is therefore common practice to divide the area provided for the totality of these memory cells on the surface of the wafer-shaped and in particular p-doped silicon crystal into identical zones by appropriate localized oxidation and to produce one two-transistor memory cell in each one of the zones thus obtained and surrounded by a frame-like, thicker oxide film Dox. This insulating method is also expediently used in the method according to the invention.

Other features which are considered as characteristic for the invention are set forth in the appended claims.

Although the invention is illustrated and described herein as embodied in a method producing a monolithically integrated two-transistor memory cell in accordance with MOS technology, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings, in which.

Figure 1:
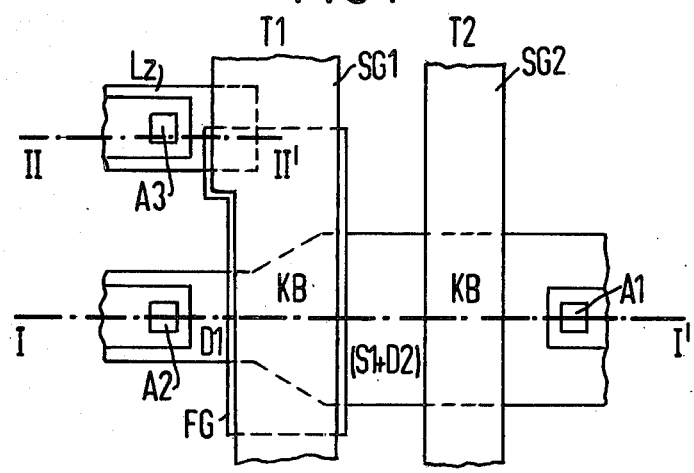
FIG. 1 is a fragmentary, diagrammatic top-plan or layout view of the two-transistor cell to be produced.
Figure 2:
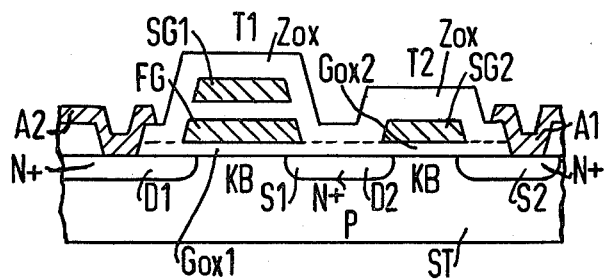
FIGS. 2 and 3 are cross-sectional views taken along the lines I—I' and II—II' of FIG. 1, respectively.
Figure 3:
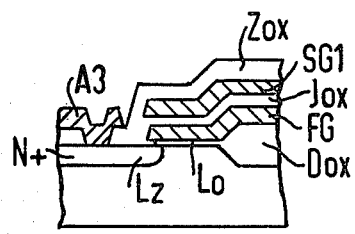

Referring now to the figures of the drawing, and first particularly to FIGS. 1-3 thereof, it is seen that the two-transistor memory cell shown therein involves the combination of a selection transistor serving for addressing the respective memory cell, such as second MOS field effect transistor T2 according to the definition of the invention, with an MOS-EEPROM storage transistor, representing the first MOS field effect transistor T1. Accordingly, the first MOS field effect transistor T1 has two polysilicon gates stacked upon each other, namely the floating gate FG and the control gate SG1. The second MOS field effect transistor T2 of the memory cell, on the other hand, has only one gate, namely the control gate SG2. In additon, it is essential that the floating gate FG and the control gate SG1 of the first transistor T1 overlap not only in the channel area KB of the first transistor T1, but also in the erase area to be disposed apart from the channel area KB, as evident from FIG. 3. The erase area is defined as the particular location on the silicon crystal surface in the area of the individual memory cell where, when erasing, the electrical charge of the floating gate contained in the respective memory cell corresponding to the "1" level is caused to disappear. As is evident from FIGS. 1 and 3, an N+-doped diffusion zone LZ is provided for this purpose in the erase area on the silicon surface. This diffusion zone LZ is shielded from the silicon surface at the diffusion zone LZ by a thin $SiO_2$ film, such as 20 to 30 nm thick, the so-called erase oxide Lo. In contrast thereto, apart from the diffusion zone LZ, the thickness of the oxide films Gox1 and Gox2 which support the floating gate FG of the first transistor T1 and the control gate SG2 of the second transistor T2 is much greater, generally as much as 100 to 120 nm.

The memory cell is programmed by means of channel injection in the channel area KB of the first MOS field effect transistor T1. The so-called Fowler-Nordheim effect is utilized for erasure, generating a tunnel current between the floating gate FG and the diffusion zone LZ in the erase area of the cell which overcomes the thin erase oxide Lo due to a 20–30 V erase voltage to be applied between the control gate SG1 of the first transistor T1 and the blockless terminal A3 of the erase diffusion zone LZ, without noticeable adverse effect on the latter.

The first MOS field effect transistor T1 has an N+-doped diffusion and/or implantation zone D1 serving as a drain and a likewise N+-doped source zone S1, produced at a distance therefrom defining the channel area KB of the first transistor T. The source zone S1 is preferably combined with the drain D2 of the second MOS field effect transistor T2 to form one common N+-zone, in the interest of simplification and reduction of the space requirement of the cell. The source zone S2 of the second transistor T2 is likewise N+-doped, whereas the channel area KB of the first transistor T1 and the channel area KB of the second transistor T2 are p-conducting and are each given, for example, by a non-redoped zone of the p-doped substrate ST.

In addition to the parts already mentioned and those forming the gate oxide Gox and the erase oxide Lo, the insulation on the memory cell surface also includes the insulation oxide Jox between the floating gate FG and the control gate SG1 of the first transistor T1, as well as a film Zox which may also be formed of $SiO_2$. Finally, the already mentioned frame oxide Dox (commonly called "field oxide") is called back to mind. The frame oxide serves to outline the silicon surface area alloted to the respective memory cell.

The method according to the invention expediently starts from a p-doped, monocrystalline, wafer-shaped silicon part, which is the substrate ST having a surface to be processed that is (100)-oriented. If applicable, the surface to be processed may also be the surface of a p-doped silicon layer which is epitaxically deposited on an n-doped silicon monocrystal. The concentration of the dope, of the substrate ST, which is boron in particular, is adjusted to a resistance of 8–10 Ohm/cm.

Figure 4:
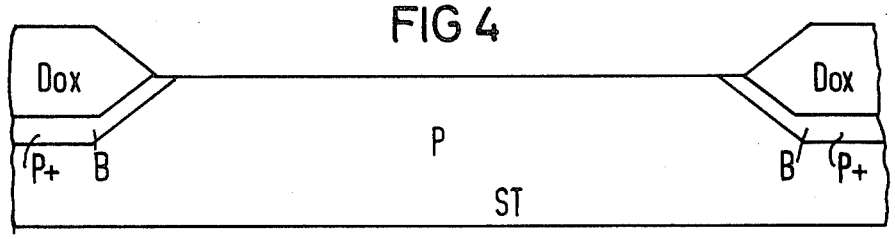
FIGS. 4, 5 and 6a and b to 10a and b are fragmentary cross-sectional views showing different stages in the development of the cell according to the method of the invention.

Before carrying out the method according to the invention, the (100)-oriented substrate surface is divided into the areas alloted to the individual memory cells by producing the field oxide Dox which surrounds the individual areas in the form of a frame. It is expedient for this purpose to first produce an oxide film that is about 10 nm thick which is covered by a silicon nitride film which is about 160 nm thick. By means of photoresist etching technology such as the use of the plasma etching method, the substrate surface areas to be provided with the field oxide Dox are bared while the substrate surface areas to be occupied by the memory cells yet to be produced and respectively surrounded by the field oxide frame stay covered by the 10 nm thick oxide film and by the silicon nitride film serving as an oxidation mask for the time being. Next, the substrate doping is increased locally at the bared substrate surface areas by implanting boron ions. Then the field oxide is produced on the substrate surface areas pretreated by the boron implantation. The thickness of the field oxide Dox is set to 1.6. $\mu$m, for example. Finally, the nitride film is removed, such as by etching with hot phosphoric acid or by plasma etching. If applicable, the oxide film used to support the silicon nitride oxidation mask may remain intact as a base for the gate oxide. In many cases, however, not only the nitride oxidation mask but also the oxide film supporting it will be removed from the silicon surface after producing the field oxide, so as to arrive at the starting condition evident from FIG. 4. FIG. 4 shows the memory cell to be produced, taken along the section line I—I' in FIG. 1. As is known, due to the boron implantation, boron-enriched zones B acting as channel stoppers are disposed below the Dox field oxide strips.

The hereinafore described method of producing the field oxide Dox is applied to gain a reduction of the structural size and of the total number of photoresist masks required. In addition, as already noted, the mutual insulation of the memory cells is improved and the section shown in FIG. 4 corresponds to line I—I' in FIG. 1 of the two-transistor memory cell to be produced.

Figure 5:
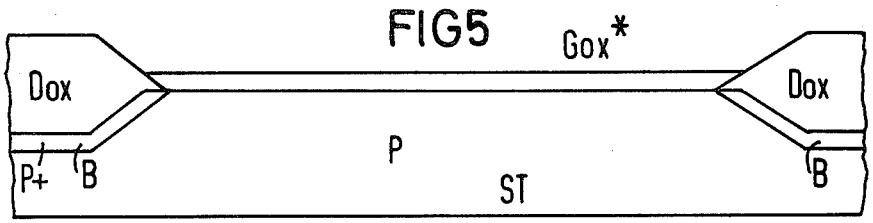

In the following first oxidation process of the actual method according to the invention, the surface of the substrate ST now bared in the various areas each intended for the production of a memory cell is covered by a first oxide film Gox* forming the base of the gate oxide Gox1 and possibly also the base of the gate oxide Gox2 at the site of the two transistors T1 and T2 to be produced. The thickness of this first oxide film Gox* is adjusted so that it, plus the thickness of the erase oxide provided, exactly equals the thickness intended for the gate oxide Gox1 at the site of the first transistor T1 (and possibly for the gate oxide Gox2 at the site of the second transistor T2). The condition thus obtained at this point along line I—I' is shown in FIG. 5.

Figure 6A:
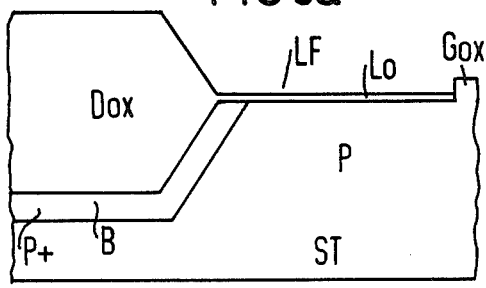
Figure 6B:
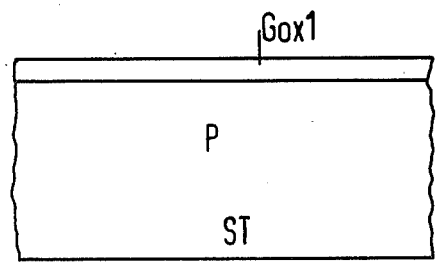

The next step which is to produce the erase window LF in the oxide film Gox* obtained by the first oxidation step is restricted exclusively to the erase area provided for the respective memory cell. As may be seen from FIG. 6a, the field oxide Dox is used as part of the boundary of the erase window LF. The erase window LF is produced in the usual manner in accordance with photoresist etching technology so that further explanations pertaining thereto are unnecessary. The section I—I' of FIG. 1 through the layout to be produced does not touch the erase area of the memory cell, and the erase window LF is to be produced apart from the channel area KB of the two transistors T1 and T2 of the memory cell. Therefore, the respective production status reached in the erase area, i.e. along section II—II' in FIG. 1, is shown in FIG. 6 and the subsequent figures in Fig. part "a" of the respective figure, and the status reached in the channel areas KB of the two transistors T1 and T2, i.e. along section I—I', is shown in Fig. part "b" of the respective figure. Accordingly, the erase window LF is visible only in FIG. 6a and not in FIG. 6b.

The arrangement obtained after making the erase window LF going through to the substrate surface, now subjected to the second oxidation process of the actual method according to the invention, in which the thin erase oxide film Lo originates inside the erase window LF and the already existing oxide films Dox and Gox* are additionally made thicker. The remaining portions of the first oxide film Gox* are grown in this manner to the desired gate oxide film Gox1 (and possibly Gox2). The state now reached is shown in FIGS. 6a and 6b. The thickness of the erase oxide Lo is set, for example, to 20–30 nm, and the thickness of the gate oxide Gox1 to about 100–120 nm.

The next step of the method according to the invention is depositing a first, preferably phosphorus-doped, polycrystalline silicon layer PS1 on the surface of the device according to FIGS. 6a and 6b that has been obtained so far. From the polysilicon layer PS1, applied over the entire surface, the floating gate FG of the first MOS field effect transistor T1 (and possibly also the control gate SG2 of the second MOS field effect transistor T2) is first produced with preliminary dimensions for the time being, in accordance with masked etching technology, as already explained above.

Figure 7A:
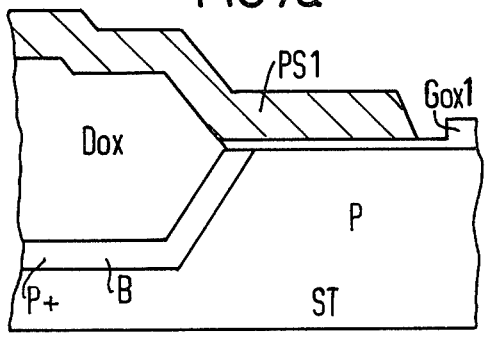
Figure 7B:
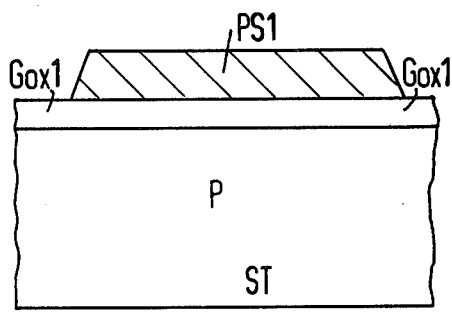
Figure 8A:
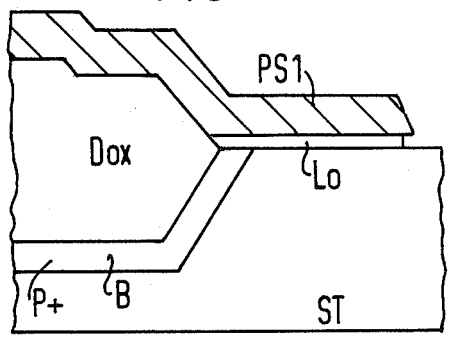
Figure 8B:
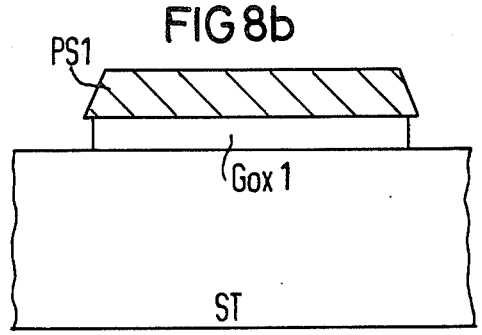

The portions of the first polycrystalline silicon layer PS1 still present on the surface of the arrangement now obtained and illustrated in FIGS. 7a and 7b, cover those portions of the gate oxide Gox1 (and possibly Gox2) as well as the erase oxide Lo which should not be affected by the oxide etching process that follows. This applies above all to the oxide Gox1 covering the channel area KB of the first MOS field effect transistor and to that part of the erase oxide Lo which supports the floating gate FG. The etching process is carried out expediently with an etchant (such as aqueous HF solution) not attacking the polycrystalline silicon in contrast to the oxide, using the portions of the first polycrystalline silicon layer PS1 still present on the surface of the arrangement to be treated as an etching mask, or by plasma etching. The result is the state evident from FIGS. 8a and 8b.

There follows another oxidation step, leading to the formation of the insulation oxide Jox on the still existing areas of the first polysilicon layer PS1. If the oxide has been removed from the semiconductor surface at the site of the second MOS field effect transistor T2 prior to depositing the first polysilicon layer PS1 and the first polycrystalline silicon layer has been deposited there directly on the surface of the silicon crystal ST, then in this variant of the method according to the invention, the first polycrystalline silicon layer PS1 is also removed from the surface of the silicon crystal ST belonging to the second transistor T2. In this way the oxidation process leading to the formation of the insulating oxide Jox also includes the silicon surface at the site of the second transistor T2. Then the oxide film thus originating forms the gate oxide film Gox2 of the second transistor T2. The just-described variant of producing the gate oxide Gox2 of the second MOS field effect transistor T2 is especially advantageous.

Figure 9A:
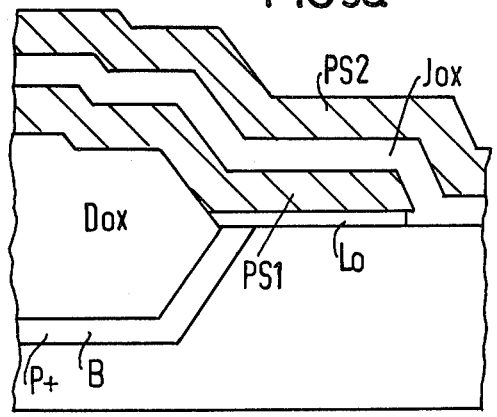
Figure 9B:
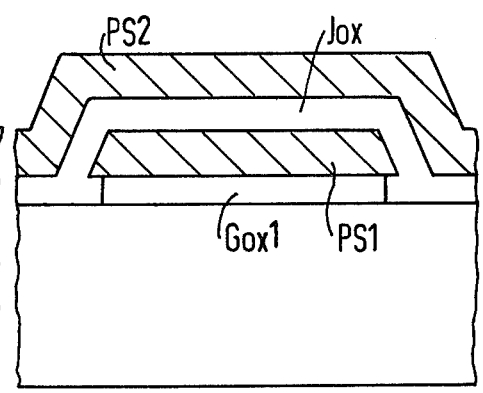

The insulating oxide film Jox and the gate oxide Gox2 of the second transistor in the case of the just-described variant of producing the gate oxide Gox2, are now provided with a doped, polycrystalline silicon control gate SG1 and SG2, respectively. For this purpose, a similarly phosphorus-doped, polycrystalline silicon layer PS2 is first deposited over the entire surface of the arrangement obtained so far, which can be done (just like the deposition of the first polysilicon layer PS1) through pyrolysis of dilute $SiH_4$ gas containing $PH_3$. The state of the arrangement now obtained is seen from FIGS. 9a and 9b.

The next step is forming the control gate SG1 of the first transistor T1, and in the herein-described preferred embodiment of the method, simultaneously forming the control gate SG2 of the second transistor T2. The known photoresist etching technology is again employed for this purpose. In such a case the oxide films Jox and Gox2 are then removed from the surface of the arrangement at the sites not covered by the control gates SG1 and SG2 of the two transistors T1 and T2 by etching the entire surface with an etchant not attacking silicon, such as dilute hydrofluoric acid. Finally, using the control gate SG1 of the first transistor T1 as an etching mask (protected when formed by a photoresist coating used as a mask), the floating gate FG of the first transistor is brought, by means of a further polysilicon etching process, from the area of the first doped polysilicon layer PS1 still present at the site of the first transistor T1, to its final shape and size. This self-adjusting etching method during the production of the two gates SG1 and FG of the first transistor T1 serves for the attainment of as exact an agreement of the lateral geometries of the two gates SG1 and FG of the first MOS field affect transistor T1 as possible.

Figure 10A:
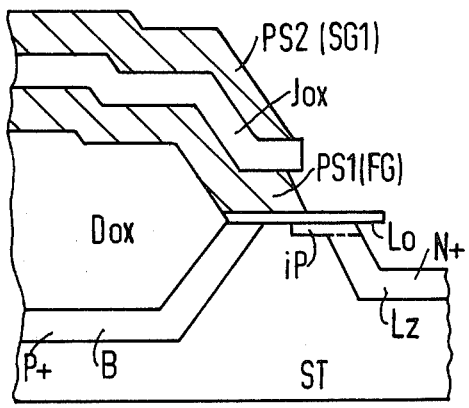
Figure 10B:
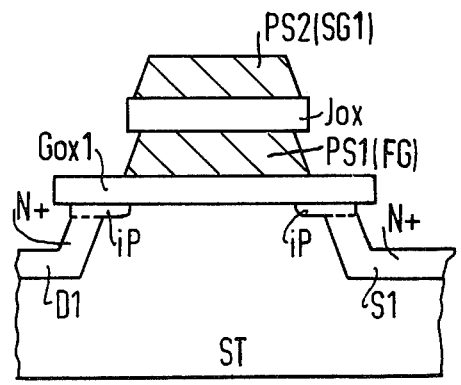

The etchant forming the polycrystalline silicon layer PS1 in the final formation of the floating gate FG also automatically attacks the spots of the monocrystalline silicon substrate ST which were bared by the removal from the substrate surface of the oxide film forming the base of the gate oxide Gox2, as FIGS. 10a and 10b show. This applies, for instance, to those silicon surface areas where the source and drain zones of the individual transistors T1 and T2 of the memory cells are yet to be produced.

Following as the next step of the method is a whole-area implantation of the side surface of the construction treated so far with a donator, such as phosphorus or arsenic, the implantation conditions being adjusted so that implantation zones iP can form only in those surface parts of the monocrystalline substrate ST which are either not covered at all or covered only by an oxide film, but not in those locations covered both by the combination of an oxide film and a polysilicon layer PS1 or PS2. As is evident from FIG. 10a, this causes an implantation zone iP to form directly under the free edge of the erase oxide Lo and below the free edges of the gate oxide Gox1 (best seen in FIG. 10b). In addition and above all, such implantation zone also forms on the surface of the source and drain regions, but not on the surface of the channel regions KB of the two transistors T1 and T2. If applicable, one such implantation for each can assume the function of the source zones S1, S2, of the drain zones D1, D2 and of the erase zone LZ in the erase region.

However, when using the oxide films Lo and Gox1 (and Gox2) as well as the polysil gates grown thereon as diffusion masks, the doping of the source and drain regions D1, S1, D2, S2 of the two transistors and the doping of the erase zone LZ of the memory cell will preferably be increased jointly. This is done by a diffusion process to be carried out subsequently and in a conventional manner, so that the implantation zones iP fuse in the substrate surface areas which are not oxide-covered to the diffusion areas developing there, and form the final source and drain zones of the two transistors T1 and T2 and the final erase region LZ. Remnants of the implantation zones iP remain intact only under the uncovered edges of the erase oxide film Lo and the edges of the gate oxide films Gox1 and Gox2. This is under the condition, however, that the diffusion depth of the diffusion zones is appropriately balanced to the lateral geometry of the implantation zones iP. As indicated, the last diffusion process may be omitted if a sufficiently low film resistance has already been obtained in the source-drain region of the two transistors T1 and T2 and in the erase region LZ due to the preceding implantation process.

Using the conventional methods for the purpose, the cover oxide forming the uppermost oxide film Zox is now produced (such as by sputtering). The contacting holes leading to the various contacting points at the source and drain of the two transistors T1 and T2, respectively, and leading to the contacting point of their control gates SG1, SG2, respectively, are then etched in this oxide film Zox in the places provided for them, and the corresponding terminals, in particular formed of aluminum, such as the terminals A1, A2, A3 (shown in FIGS. 1 to 3) as well, are made in a conventional manner. The terminals may coincide with the conductors serving for the connection between the individual memory cells. FIGS. 10a and 10b show the condition as reached along the lines II—II' and I—I', respectively, and as present immediately after the last diffusion process and before the external oxide film Zox is provided. The field oxide Dox is not shown in FIGS. 6b, 7b, 8b, 9b and 10b. FIGS. 10a and 10b clearly indicate that simultaneously with the final formation of the floating gate FG, an erosion of the free substrate surface areas has also taken place, while the oxide-covered portions of the substrate surface are underetched slightly at the edge only.

The method described by way of FIGS. 4 to 10a represents a particularly advantageous embodiment of the invention. Due to the fact that the invention avoids so-called oxide fillets under the edges of the floating gate FG and the edges of the control gate SG1 of the first transistor T1 of the memory cell, this embodiment of the method according to the invention leads not only to an improvement of the quality of the etire oxide insulation of the memory cell, but above all also to a distinct increase in the number of erase cycles which can be demanded of the respective memory cell, and hence to increased life of the memory cell.

The electrical erasure of the information content stored in the memory cell can be achieved by very low tunnel currents due to the application of the method according to the invention in the production of the memory cell. Therefore, the layer resistance level of the implanted region iP in the erase area of the memory cell is relatively non-critical. On the other hand, the programming behavior of the memory cell depends sensitively on the layer resistance of the source-drain terminal areas of the first transistor T1 of the memory cell.

Therefore, should the layer resistance of the source-drain terminal areas of the first transistor T1 of the memory cell require an additional reduction, it is recommended to etch away those parts of the gate oxide Gox1 which project beyond the floating gate FG of the first transistor T1 of the memory cell, using a further masking step to protect the erase area and to pull the source and drain region S1, D1 to the edge of the control gate SG1 and to the edge of the floating gate FG of the transistor T1.

There are claimed:

1. In a method of producing a monolithically integrated two-transistor memory cell in accordance with MOS technology, including a silicon crystal for accommodating the memory cell and having a surface, a first MOS field effect transistor for information storage having a current-carrying channel and both a control gate and a floating gate located between the control gate and the surface of the crystal, a second MOS field effect transistor having a current-carrying channel and a control gate, an $SiO_2$ film supporting the gates, a doped polycrystalline silicon layer deposited on the $SiO_2$ film, the control gates and the floating gate being formed by masked etching technology of the doped polycrystalline silicon layer, and an erase area apart from the current-carrying channel of the two MOS field effect transistors of the memory cell for the floating gate of the first MOS field effect transistor, the improvement which comprises preparing the surface of the silicon crystal for implantation, initially covering a part of the surface of the silicon crystal intended for the memory cell with an $SiO_2$ film by thermal oxidation forming a part of the gate oxide of the first MOS field effect transistor of the memory cell, forming a window through the $SiO_2$ film at a location intended for the erase area of the memory cell exposing an area of the surface of the silicon crystal and leaving remaining areas of the $SiO_2$ film, subsequenty re-oxidizing the exposed area of the surface of the crystal in the window in the erase area and simultaneously increasing the remaining areas of the $SiO_2$ film to a given final thickness of the gate oxide in a further joint oxidation process producing a new thinner $SiO_2$ film in the window in the erase area, subsequently depositing a first doped polycrystalline silicon layer forming a base of the floating gate of the first MOS field effect transistor on the gate oxide film including the new thinner $SiO_2$ film, covering the doped polycrystalline silicon layer with another $SiO_2$ film at least in the part thereof forming the floating gate, depositing a second doped polycrystalline silicon layer on the other $SiO_2$ film, and forming the control gates of the first and of the second MOS field effect transistors from the second doped polycrystalline silicon layer and producing the source and drain zones of the two MOS field effect transistors by at least one of diffusion and implantation at sites on the surface of the crystal uncovered for this purpose.

2. Method according to claim 1, which comprises etching away the first doped polycrystalline layer again after it is deposited from the oxide film supporting it at the side of the source and drain area of the first transistor and at an edge of the window in the intended erase area uncovering parts of the oxide film, the edge facing away from the floating gate to be formed, and leaving the first doped polycrystalline layer intact at least at the site of the floating gate to be formed, and subsequently removing the uncovered parts of the oxide film from the surface of the silicon crystal supporting them.

3. Method according to claim 2, which comprises removing the first polycrystalline silicon layer and the oxide film from the part of the surface of the silicon crystal intended for the second MOS field effect transistor.

4. Method according to claim 2 or 3, which comprises producing a coherent oxide film by a joint oxidation process at surface locations of the silicon crystal uncovered again directly after producing the first polycrystalline silicon layer and on the surface of the remaining parts of the first polycrystalline layer, and depositing the second polycrystalline silicon layer on the coherent oxide film forming the base of the control gate of the first MOS field effect transistor and forming the base of the control gate of the second field effect transistor.

5. Method according to claim 4, which comprises forming the control gate of the first MOS field effect transistor and forming the control gate of the second MOS field effect transistor from the second polycrystalline silicon layer by masked etching initially, and subsequently using one of the control gate of the first effect transistor and the etching mask covering it to form the floating gate from the first polycrystalline silicon layer.

6. Method according to claim 1, which comprises keeping the oxide film located under the floating gate directly after the formation of the floating gate of the first MOS field effect transistor intact without further erosion to avoid oxide fillets.

7. Method according to claim 1, which comprises providing an implantation treatment with a doping material producing the conductivity type of the source and drain zone of the MOS field effect transistors at least at the site of the first transistor following the production of the gates of both transistors, and adjusting the implantation conditions for allowing incident ions of the doping material to be implanted to travel into the silicon crystal exclusively where the crystal is covered at most by an oxide film alone and not by a combination of an oxide film and a polycrystalline silion layer.

8. Method according to claim 7, which comprises performing a diffusion treatment following the implantation with a doping material producing the same conductivity type as the implantation, at surface points of the silicon crystal not covered during the implantation, and restricting the diffusion treatment to those points alone.

9. In a method of producing a monolithically integrated two-transistor memory cell in accordance with MOS technology, including a silicon crystal for accomodating the memory cell and having a surface, a first MOS field effect transistor for information storage having a current-carrying channel and both a control gate and a floating gate disposed between the control gate and the surface of the crystal, a second MOS field effect transistor having a current-carrying channel and a control gate, an $SiO_2$ film supporting the gates, a doped ploycrystalline silicon layer deposited on the $SiO_2$ film, the control gates and the floating gate being formed by masked etching technology of the doped polycrystalline silicon layer, and an erase area apart from the current-carrying channel of the two MOS field effect transistors of the memory cell for the floating gate of the first MOS field effect transistor, the improvement which comprises preparing the surface of the silicon crystal for implantation, initially covering a part of the surface of the silicon crystal intended for the memory cell with an $SiO_2$ film by thermal oxidation forming a part of the gate oxide of the first MOS field effect transistor of the memory cell, forming a window through the $SiO_2$ film at a location intended for the erase area of the memory cell exposing an area of the surface of the silicon crystal and leaving remaining areas of the $SiO_2$ film, subsequently re-oxidizing the exposed area of the surface of the crystal in the window in the erase area and simultaneously increasing the remaining areas of the $SiO_2$ film to a given final thickness of the gate oxide in a further joint oxidation process producing a new thinner $SiO_2$ film in the window in the erase area, subsequently depositing a first doped ploycrystalline silicon layer forming a base of the floating gate of the first MOS field effect transistor on the gate oxide film including the new thinner $SiO_2$ film, covering the doped polycrystalline silicon layer with another $SiO_2$ film at least in the part thereof forming the floating gate, depositing a second doped polycrystalline silicon layer on the other $SiO_2$ film, forming the control gate of the first MOS field effect transistor from the second doped polycrystalline silicon layer and producing the source and drain zones of the two MOS field effect transistors by at least one of diffusion and implantation at sites on the surface of the crystal uncovered for this purpose, etching away the first doped polycrystalline layer again after it is deposited from the oxide film supporting it at the side of the source and drain area of the first transistor and at an edge of the window in the intended erase area uncovering parts of the oxide film, the edge facing away from the floating gate to be formed, and leaving the first doped polycrystalline layer intact at least at the site of the floating gate to be formed, subsequently removing the uncovered parts of the oxide film from the surface of the silicon crystal supporting them, removing the first polycrystalline silicon layer and the oxide film from the part of the surface of the silicon cyrstal intended for the second MOS field effect transistor, producing a cohorent oxide film by a joint oxidation process at surface locations of the silicon crystal uncovered again directly after producing the first polycrystalline silicon layer and on the surface of the remaining parts of the first polycrystalline layer, depositing the second ploycrystalline silicon layer on the coherent oxide film forming the base of the control gate of the first MOS field effect transistor and optionally forming the base of the control gate of the second field effect transistor, forming the control gate of the first MOS field effect transistor and optionally forming the control gate of the second MOS field effect transistor from the second ploycrystalline silicon layer by masked etching initially, and subsequently using one of the control gate of the first field effect transistor and the etching mask covering it to form the floating gate from the first polycrystalline silicon layer.

* * * * *